US012645153B2

(12) United States Patent
Van Laarhoven et al.

(10) Patent No.: US 12,645,153 B2
(45) Date of Patent: Jun. 2, 2026

(54) METHOD OF DETERMINING A MEASUREMENT RECIPE AND ASSOCIATED METROLOGY METHODS AND APPARATUSES

(71) Applicant: ASML NETHERLANDS B.V., Veldhoven (NL)

(72) Inventors: Hendrik Adriaan Van Laarhoven, Nuenen (NL); Bastiaan Maurice Van Den Broek, Helmond (NL); Vito Daniele Rutigliani, Lommel (BE)

(73) Assignee: ASML NETHERLANDS B.V., Veldhoven (NL)

( * ) Notice: Subject to any disclaimer, the term of this patent is extended or adjusted under 35 U.S.C. 154(b) by 372 days.

(21) Appl. No.: 18/275,663

(22) PCT Filed: Jan. 12, 2022

(86) PCT No.: PCT/EP2022/050480
§ 371 (c)(1),
(2) Date: Aug. 3, 2023

(87) PCT Pub. No.: WO2022/167178
PCT Pub. Date: Aug. 11, 2022

(65) Prior Publication Data
US 2024/0111221 A1      Apr. 4, 2024

(30) Foreign Application Priority Data
Feb. 3, 2021    (EP) ..................................... 21154914

(51) Int. Cl.
*G03F 7/00* (2006.01)
(52) U.S. Cl.
CPC .... *G03F 7/706841* (2023.05); *G03F 7/70633* (2013.01); *G03F 7/706831* (2023.05)

(58) Field of Classification Search
CPC ........... G03F 7/706841; G03F 7/70633; G03F 7/706831; G03F 7/70683; G03F 7/70616
See application file for complete search history.

(56) References Cited

U.S. PATENT DOCUMENTS

| | | | |
|---|---|---|---|
| 9,093,458 B2 | 7/2015 | Amir et al. | |
| 10,387,608 B2 * | 8/2019 | Adel ......................... | G03F 1/36 |

(Continued)

FOREIGN PATENT DOCUMENTS

| | | |
|---|---|---|
| EP | 3321737 | 5/2018 |
| EP | 3444674 | 2/2019 |

(Continued)

OTHER PUBLICATIONS

International Search Report and Written Opinion issued in corresponding PCT Patent Application No. PCT/EP2022/050480, dated Mar. 14, 2022.

(Continued)

*Primary Examiner* — Tung S Lau
(74) *Attorney, Agent, or Firm* — Pillsbury Winthrop Shaw Pittman, LLP

(57) ABSTRACT
A method of determining a measurement recipe for measurement of in-die targets located within one or more die areas of an exposure field. The method includes obtaining first measurement data relating to measurement of a plurality of reference targets and second measurement data relating to measurement of a plurality of in-die targets, the targets having respective different overlay biases and measured using a plurality of different acquisition settings for acquiring the measurement data. One or more machine learning models are trained using the first measurement data to obtain a plurality of candidate measurement recipes, wherein the candidate measurement recipes include a plurality of combinations of a trained machine learned model and a corresponding acquisition setting; and a preferred measurement (Continued)

recipe is determined from the candidate measurement recipes using the second measurement data.

20 Claims, 3 Drawing Sheets

(56) References Cited

U.S. PATENT DOCUMENTS

| | | | |
|---|---|---|---|
| 10,599,048 | B2 | 3/2020 | Tarabrin et al. |
| 10,691,031 | B2 | 6/2020 | Tarabrin |
| 10,795,269 | B2 | 10/2020 | Zhou et al. |
| 11,022,897 | B2 | 6/2021 | Venselaar et al. |
| 11,079,684 | B2 | 8/2021 | Bijnen et al. |
| 11,086,305 | B2 | 8/2021 | Roy et al. |
| 11,143,972 | B2 | 10/2021 | Tsiatmas et al. |
| 2006/0016561 | A1 | 1/2006 | Choi et al. |
| 2006/0033921 | A1 | 2/2006 | Den Boef et al. |
| 2007/0085991 | A1 | 4/2007 | Liegl et al. |
| 2010/0201963 | A1 | 8/2010 | Cramer et al. |
| 2010/0214550 | A1 | 8/2010 | Hulsebos et al. |
| 2010/0328655 | A1 | 12/2010 | Den Boef |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2011/0102753 | A1 | 5/2011 | Van De Kerkhof et al. |
| 2012/0008127 | A1 | 1/2012 | Tel et al. |
| 2012/0044470 | A1 | 2/2012 | Smilde et al. |
| 2012/0123581 | A1 | 5/2012 | Smilde et al. |
| 2013/0258310 | A1 | 10/2013 | Smilde et al. |
| 2013/0271740 | A1 | 10/2013 | Quintanilha |
| 2019/0049859 | A1 | 2/2019 | Tsiatmas et al. |
| 2019/0378012 | A1* | 12/2019 | Tripodi ................. G06N 3/0455 |
| 2021/0405544 | A1* | 12/2021 | Werkman ................. G06N 3/09 |
| 2022/0276570 | A1* | 9/2022 | Rahman ................. G03F 7/7045 |

FOREIGN PATENT DOCUMENTS

| | | |
|---|---|---|
| TW | 201921149 | 6/2019 |
| TW | 201925910 | 7/2019 |
| TW | 201931020 | 8/2019 |
| TW | 201931021 | 8/2019 |
| TW | 201935150 | 9/2019 |
| TW | 201937297 | 9/2019 |
| TW | 202101633 | 1/2021 |
| WO | 2011/081645 | 7/2011 |
| WO | 2013/178422 | 12/2013 |
| WO | 2015/101458 | 7/2015 |
| WO | 2017/186483 | 11/2017 |
| WO | 2018/233947 | 12/2018 |
| WO | 2020/094286 | 5/2020 |
| WO | 2020/182468 | 9/2020 |
| WO | WO 2020182468 A1* | 9/2020 |

OTHER PUBLICATIONS

Office Action issued in corresponding Taiwanese Patent Application No. 111103843, dated Sep. 13, 2022.
Y.S. Ku et al., "In-chip overlay metrology for 45nm processes", Proc. of SPIE, vol. 6617, pp. 1-12 (2007).

* cited by examiner (a)

(b)

METHOD OF DETERMINING A MEASUREMENT RECIPE AND ASSOCIATED METROLOGY METHODS AND APPARATUSES

CROSS-REFERENCE TO RELATED APPLICATIONS

This application is the U.S. national phase entry of PCT Patent Application No. PCT/EP2022/050480 which was filed on Jan. 12, 2022, which claims priority of European Patent Application No. 21154914.2, which was filed on Feb. 3, 2021 and which is incorporated herein in its entirety by reference.

BACKGROUND

Field of the Invention

The present invention relates to a metrology apparatus and methods usable, for example, to perform metrology in the manufacture of devices by lithographic techniques. The invention further relates to such methods for monitoring a parameter of interest such as overlay in a lithographic process

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

It has been observed that metrology on targets having pitches and/or dimensions different to the product structure may not be truly representative of the product structure. To address this, in-die metrology has been developed to better monitor one or more parameters of interest (e.g., overlay) by measuring structures which are of a size comparable to the product. It would be desirable to improve on such in-die metrology methods.

SUMMARY OF THE INVENTION

The invention in a first aspect provides a method of determining a measurement recipe for measurement of in-die targets located within one or more die areas of an exposure field; the method comprising: obtaining first measurement data relating to measurement of a plurality of reference targets, said reference targets comprising respective different overlay biases and being located in at least one reference target cluster for each exposure field on a training substrate; wherein said first measurement data further relates to measurement of said reference targets using a plurality of different acquisition settings for acquiring said measurement data; obtaining second measurement data relating to measurement of a plurality of in-die targets, said in-die targets comprising respective different overlay biases and being distributed over each exposure field; wherein said second measurement data further relates to measurement of said in-die targets using said plurality of different acquisition settings for acquiring said measurement data; training one or more machine learning models using at least said first measurement data to obtain a plurality of candidate measurement recipes, wherein said candidate measurement recipes comprise a plurality of combinations of a trained machine learned model and a corresponding acquisition setting; and determining a preferred measurement recipe from said candidate measurement recipes using said second measurement data.

The invention yet further provides a computer program product comprising machine-readable instructions for causing a processor to perform the method of the first aspect, and associated metrology apparatus and lithographic system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4(*b*) is a schematic illustration of an in-die target layout according to an embodiment of the invention.

DETAILED DESCRIPTION OF EXEMPLARY EMBODIMENTS

Before describing embodiments of the invention in detail, it is instructive to present an example environment in which embodiments of the present invention may be implemented.

Figures 1, 2:
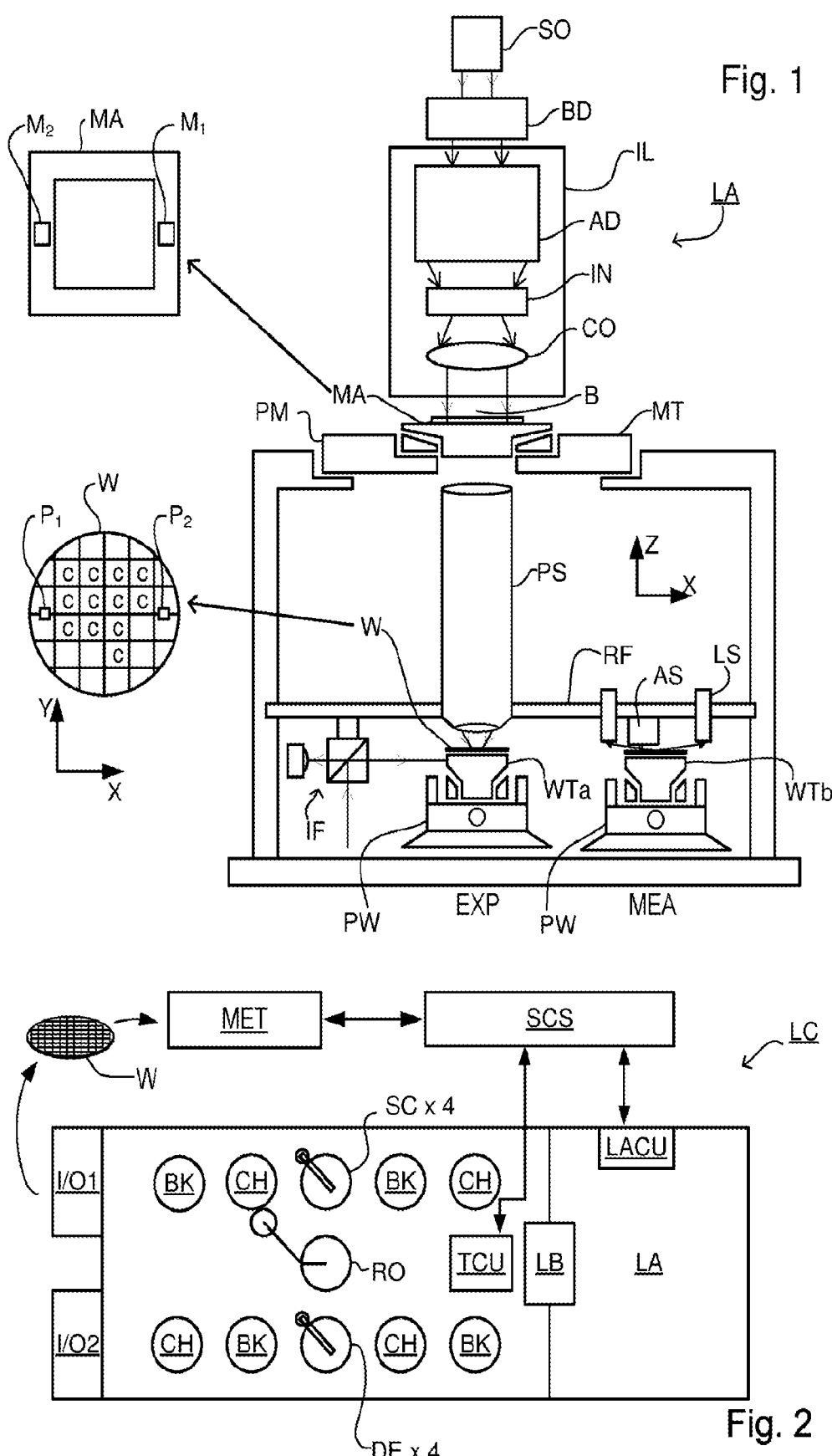
FIG. 1 depicts a lithographic apparatus.
FIG. 2 depicts a lithographic cell or cluster in which an inspection apparatus according to the present invention may be used.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms; the patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A metrology apparatus suitable for use in embodiments of the invention is shown in FIG. 3(a). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 3:
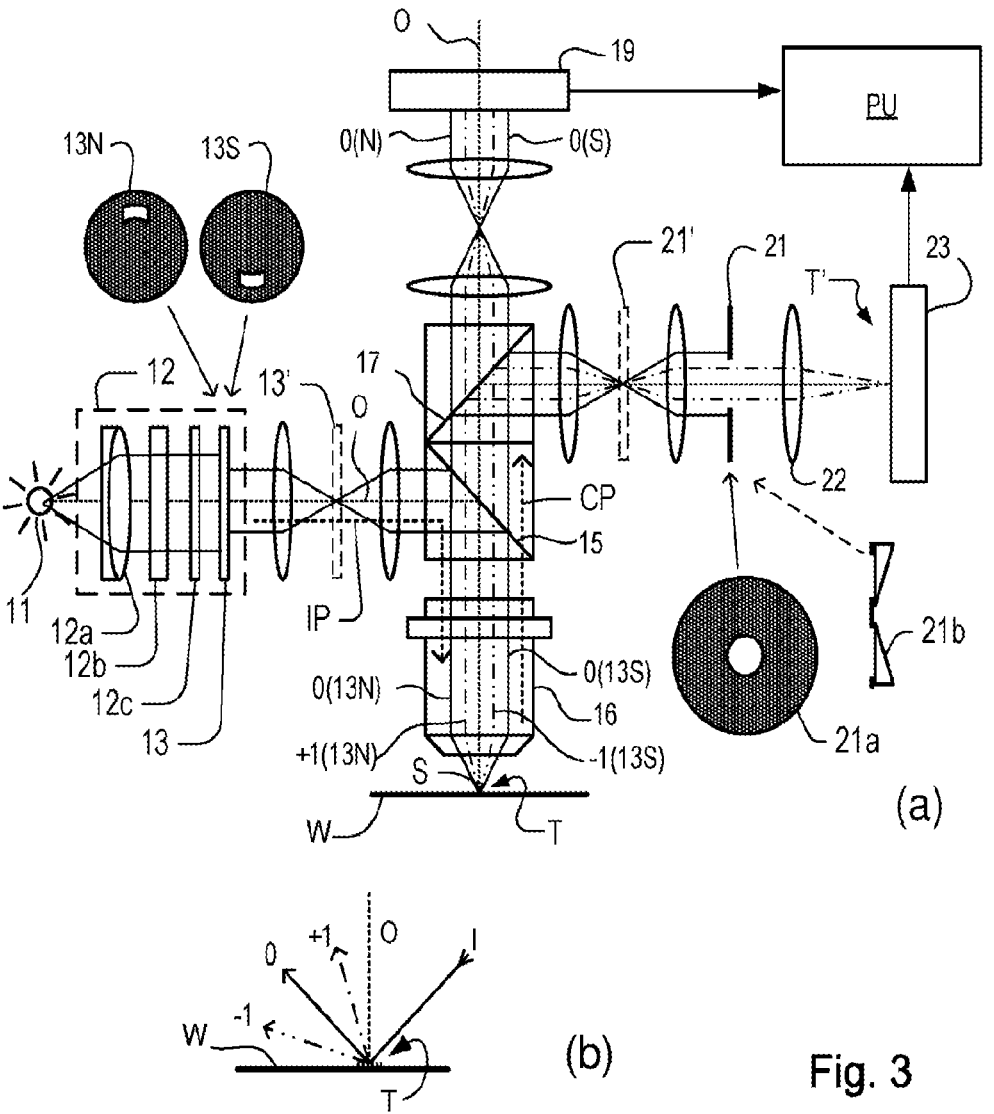
FIG. 3 illustrates schematically an inspection apparatus adapted to perform angle-resolved scatterometry and dark-field imaging inspection methods.

As shown in FIG. 3(*b*), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1), hereafter referred to as a pair of complementary diffraction orders. It should be noted that the pair of complementary diffraction orders may be any higher order pair; e.g., the +2, −2 pair etc. and is not limited to the first order complementary pair. It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 3(*a*) and 3(*b*) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 3(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Position errors may occur due to an overlay error (often referred to as "overlay"). The overlay is the error in placing a first feature during a first exposure relative to a second feature during a second exposure. The lithographic apparatus minimizes the overlay errors by aligning each substrate accurately to a reference prior to patterning. This is done by measuring positions of alignment marks on the substrate using an alignment sensor. More information on the alignment procedure can be found in U.S. Patent Application Publication No. US 2010-0214550, which is incorporated herein in its entirety by reference. Pattern dimensioning (e.g., CD) errors may, for example, occur when the substrate is not positioned correctly with respect to a focal plane of the lithographic apparatus. These focal position errors may be associated with un-flatness of a substrate surface. The lithographic apparatus aims to minimize these focal positon errors by measuring the substrate surface topography prior to patterning using a level sensor. Substrate height corrections are applied during subsequent patterning to help assure correct imaging (focusing) of the patterning device onto the substrate. More information on the level sensor system can be found in U.S. Patent Application Publication No. US 2007-0085991, which is incorporated herein in its entirety by reference.

Besides the lithographic apparatus LA and the metrology apparatus MT, one or more other processing apparatuses may be used during device production as well. An etching station (not shown) processes the substrates after exposure of the pattern into the resist. The etch station transfers the pattern from the resist into one or more layers underlying the resist layer. Typically etching is based on application of a plasma medium. One or more local etching characteristics may e.g. be controlled using temperature control of the substrate or directing the plasma medium using a voltage controlled ring. More information on etching control can be found in PCT Patent Application Publication No. WO 2011-081645 and U.S. Patent Application Publication No. US 2006-016561, which are incorporated herein in their entireties by reference.

During the manufacturing of devices, it is desired that the process conditions for processing substrates using one or more processing apparatuses such as the lithographic apparatus or etching station remain stable such that properties of the features remain within certain control limits Stability of the process is of particular significance for features of the functional parts of an electric device such as an IC, also referred to as product features. To help ensure stable processing, process control capabilities should be in place. Process control involves monitoring of processing data and implementation of means for process correction, e.g. control a processing apparatus based on one or more characteristics of the processing data. Process control may be based on periodic measurement by the metrology apparatus MT, often referred to as "Advanced Process Control" (further also referenced to as APC). More information on APC can be found in U.S. Patent Application Publication No. US 2012-008127, which is incorporated herein in its entirety by reference. A typical APC implementation involves periodic measurements on metrology features on the substrates to monitor and correct drifts associated with one or more processing apparatuses. The metrology features reflect the response to process variations of the product features. The sensitivity of the metrology features to process variations may be different compared to the sensitivity to the product features. In that case, a so-called "Metrology To Device" offset (also referenced to as MTD) may be determined.

One reason for this MTD offset is that the actual product structures are often much (orders of magnitude) smaller than the size of the target structures which are required for scatterometry or imaging measurements, and this difference in size can result in different parameter behavior (e.g., pattern placement and resulting overlay for metrology targets may differ from pattern placement and resulting overlay of actual structures). To mimic the behavior of product features, features within the metrology targets may be made smaller (e.g., of comparable size to the product structures, which can be referred to as at-resolution overlay ARO), incorporate segmented features, assist features or features with a particular geometry and/or dimension. A carefully designed metrology target ideally should respond in a similar fashion to process variations as do the product features. More information on metrology target design can be found in PCT Patent Application Publication No. WO 2015-101458 which is incorporated herein in its entirety by reference.

In another approach, metrology may be performed directly on the product structure. This can be done using a scanning electron microscope (SEM) or an e-beam metrology apparatus for example. However, these devices are typically too slow for process control in a commercial (high-volume manufacturing HVM) environment. Another alternative, referred to as in-device metrology IDM, may comprise using a scatterometer based metrology apparatus to measure the product structure directly. Modern scatterometry tools such as illustrated in FIG. 3 have the capability of measuring (at least) an asymmetry based metric (e.g., overlay) on such small structures. However, this is usually only possible for product structures (e.g., types of memory) which have sufficient regularization (are sufficiently periodic) such that they can act as an effective diffraction grating. All features within the spot add to the pupil, so features should be regular over the whole spot in order to get signal. Less regular product structures, such as (for example) logic structures, cannot be measured in this way.

A present method for IDM metrology for non-periodic structures (e.g., logic structures) may comprise training a machine learning model, (ML model) such as a neural network, such that it can map measured pupils from an IDM target or in-die target to a value for a parameter of interest (i.e., an overlay value). The in-die targets are designed to be representative (e.g., to mimic the exposure behavior, or more generally, the full patterning behaviour including expose, etch, clean, ash, etc.) of the non-periodic/logic structure, and as such may be designed for a particular logic structure or type of logic structure. Example methods for doing this will be described later.

By using an ML model, an intensive reconstruction of the stack to obtain an overlay value is not required. Due to the dimensional reduction inherent in machine learning techniques, an effective model can be arrived at considerably cheaper than by using reconstruction techniques. However, a trained model is only as good as its training data: e.g., in terms of the quality of the data, and/or which phenomena the data captures.

The in-die targets may be measured using the first measurement branch of the tool of FIG. 3, or other suitable angle-resolved metrology apparatus to obtain a measurement pupil. A measurement pupil may comprise an "image" or acquisition of the pupil plane, i.e., an angle resolved spectrum or Fourier representation of the scattered radiation from the in-die target.

To train the ML model, self-referencing targets or reference targets may be provided on a reticle which also comprises the in-die targets. These in-die and reference targets can then be exposed, processed (e.g., developed, etched etc.) on a wafer and measured. These reference targets may, for example, be located at the periphery of the field (in a scribe lane).

The reference targets typically comprise a target array comprising multiple targets with different biases. The biases may average (or sum to) zero over the array such that a measurement averaged over the array should represent the on-product overlay. Pupils acquired on each reference target are labeled with the overlay bias (across the exposed layers) for training purposes. These training label biases/overlay values are known with good accuracy, since reticle writing error is small. The model then learns to associate a specific reference target pupil response with its respective reference target overlay bias value or label.

The training may be repeated for different acquisition settings (e.g., wavelengths/polarizations etc. of the measurement radiation) and/or other settings varied and/or for different training wafers, e.g., to allow for processing variations between nominally identical targets. The output of such training may comprise multiple, e.g., in the order of hundreds (for example between 100 and 500), candidate measurement recipes, wherein a measurement recipe may be a combination of a trained ML model and an acquisition setting. For example, during training the acquisition setting may be a free parameter such that each acquisition setting has a corresponding model, such that a measurement recipe comprises the combination of these. There will be different weight matrices within the model for each recipe.

In the present implementation of such in-die metrology, the in-die targets are formed without any intentional overlay bias and therefore have no explicit label (i.e. they are labeled zero). A matching step is then performed to determine a matching metric or matching indicator (matching KPI) which quantifies how well matched the in-die target response is to the self reference target response. This matching is typically performed by inferring an overlay value from the reference targets using a candidate metrology recipe and comparing this to an inferred overlay value from an in-die target using the same candidate metrology recipe. The closer the inferred values are, the better matched the measurement recipe is (e.g., the matching KPI may be based on the difference between the values). More specifically, present methods may compare an average of the inferred overlay values from the reference target (over which the biases will average/sum to zero) and an overlay value inferred from a single in-die target (for example the in-die target nearest the reference cluster).

These recipes may be ranked according to various performance indicators or KPIs (e.g., which may include inter alia the matching KPI, an accuracy of overlay prediction KPI, a reproducibility KPI and a repeatability KPI which addresses the error when tracking OPO variation through time). At least one of these recipes may then be chosen for production/HVM monitoring based on the one or more KPIs.

Once trained, the ML model may be used in a production monitoring environment (e.g., a high volume manufacturing HVM environment) to translate measurement pupils (angularly resolved measurement spectra) from the in-die targets exposed on a wafer to an overlay value.

As described, one of the necessary steps in the ML training is to match the recipe made on the reference target cluster to the in-die targets. With the present methodology just described, overlay offset matching between reference targets and the device (in-die targets) is possible, but not a proper matching of the overlay dependent method sensitivity of the target types, i.e., to match the recipe made on the reference targets to the in-die targets. Currently all in-die targets have zero bias applied, and as such the overlay value is comparable the device-on product overlay. This means that the reference to in-die matching is limited and as a result, sub-optimal recipes may be chosen which have good overlay response on the reference targets but not on the in-device targets. Complementary to this, the in-die targets are currently not overlay biased and as such they represent the product structure. These are used to infer the on-product overlay (OPO) at their intrafield location, which is a proxy for the OPO of the actual in-die structure. As the training is performed on only one offset per field, only an interfield model is learned. As such, the inferred intrafield fingerprint is generated by a learned interfield model, and will therefore not capture high frequency intrafield overlay content.

A method will now be described for improving recipe matching between a recipe made on the reference targets and the in-die targets, e.g., in terms of overlay dependent method sensitivity.

In an embodiment a method is disclosed which improves the ML model by explicitly learning for the intrafield fingerprint.

Figure 4:
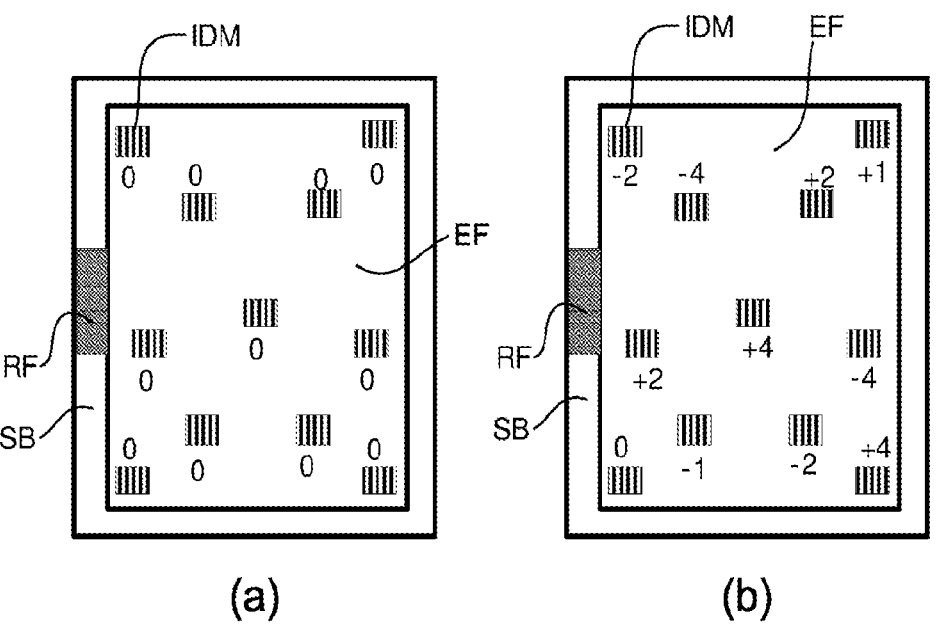
FIG. 4(*a*) is a schematic illustration of an in-die target layout according to a known method.

FIG. 4(a) shows an arrangement of in-die targets IDM and a reference target array RF on a reticle defining an exposure field EF and field scribe SB, as presently used for logic device applications (i.e., where direct measurement on the device structure is not possible). The zeroes next to the in-die targets IDM represent the imposed overlay bias; i.e., the in-die targets are all unbiased, i.e. the bias is zero.

The training may be performed using a specific training reticle (e.g., comprising the reference targets) via training exposures on training wafers. However, it may be preferred to use the same reticle for training and HVM monitoring. This is because the reference targets may be used for runtime recipe monitoring, to check that the recipe performance does not deteriorate (e.g., due to process variation). Alternatively, the recipe monitoring may be performed on the biased targets; in such as case the reference cluster may not be required and HVM reticles may dispense with the reference targets.

FIG. 4(b) illustrates an arrangement of in-die targets IDM and a reference target array RF on a reticle according to an embodiment. The in-die target arrangement may be essentially similar to that of FIG. 4(a) except that at least some of the targets are biased. i.e., the overlay bias of at least some of the targets is non zero. More specifically, the in-die targets may comprise a corresponding target for some or all of the reference targets in the reference target cluster. In this context, a "corresponding target" may refer to a target having the same or corresponding imposed bias, such that a +2 biased in-die target corresponds to a +2 biased reference target. As with the reference target cluster, the bias of the in-die targets may average and/or sum to zero. The bias values may describe the applied bias in nanometers or may be representative of the bias magnitude and direction (e.g., +1 is a first positive bias, +2 is a second positive bias etc.).

The in-die targets should be sufficiently small so as to be accommodated within the die. For example, the exposed target may be smaller than 8 μm, be smaller than 7 μm or be smaller than 6 μm in one or both directions of the substrate plane. More specifically, the exposed in-die targets may be approximately 5 μm×5 μm.

The number of in-die targets may be between, and including, sparse and dense, such as between and 50, between 10 and 50, between 10 and 40, between 15 and 40, between 15 and 30 or in the region of 20, for example.

The in-die targets may be arranged separately, i.e., one by one, or grouped, i.e., in a number of groups of a few in-die targets, within the die.

In an embodiment, the biased in-die targets may be used to improve reference target to in-die target matching and recipe optimization. As has already been described, matching is presently performed based on a single in-die target matched to reference target cluster average per field (one matched offset per field). Instead of this, a proposed method comprises determining a matching KPI for each candidate measurement recipe from differences or comparisons between corresponding reference and in-die targets per field; i.e., the +1 biased reference target may be matched to the +1 biased in-die target, the +2 biased reference target matched to the +2 biased in-die target etc. These differences/comparisons may be averaged or otherwise combined to obtain an improved matching KPI for each measurement recipe based on more information including overlay dependent method sensitivity to different overlay magnitudes (biases).

In this manner, the reference to in-die matching is broken down into a reference target biased in-die matching KPI, which will affect (i.e., improve) the recipe ranking. This more elaborate matching will improve the accuracy of the model, because the accuracy of the inferred overlay is sensitive to the magnitude of this overlay (i.e., the error on the local inferred overlay is dependent on the bias values itself).

The ranking KPIs may be based on one or more of, for example, inter alia: a reproducibility KPI, accuracy KPI, and the matching KPI. For example, each recipe may be assigned a ranking number based on a weighted combination (e.g., sum) of these KPIs. A top or favored recipe can then be chosen based on the KPI. It can be appreciated that there may be other considerations factored for (e.g., some acquisition settings may be preferred over others) such that it is not necessarily the very top ranked recipe which is chosen, but another highly ranked recipe or good performing recipe.

Any subsequent measurements of the in-die targets (e.g. in HVM) may then use the recipe with that particular acquisition setting.

In such an embodiment, it may be that biasing of the in-die targets and corresponding overlay weighting is used only for this matching and recipe optimization, and not used in training of the model (i.e., not captured in weight matrices). Such an embodiment will improve interfield modelling only.

However, in another embodiment, the biased (and labeled) in-die targets may be used to capture intrafield variation and learn it.

The difference between the reference target overlay-labeled pupils and the in-die target overlay-labeled pupils is the length scale. The reference targets are arranged close together in the field (packed into a small area) and therefore any on-product overlay variation across the different reference targets is typically small. Because of this, the overlay variation which is acquired will be the field-to-field variation (i.e., interfield content), and the ML model will only learn this interfield variation. By contrast, the in-die targets have a much wider distribution in the field, covering locations distributed over much of the field area, and as such their on-product overlay variation is larger (i.e., the intrafield content to learn). This content is not accessible to the reference target cluster alone, nor is it accessible with non-biased in-die targets.

The proposed embodiment uses the biased in-die training labels to train the model to learn the intrafield OV variation. Before training the model, pupils from each of the reference targets are obtained and labeled with their corresponding overlay biases (as before). Additionally, pupils from each of the in-die targets are obtained and also labeled with their corresponding overlay biases. The interfield variation may be learned as before based on the reference targets only (and one in-die pupil for calculating the matching KPI) so as to determine a single overlay value per field. However, now the ML model can also learn an intrafield variation component based on differences over each field between measurements of each reference target and its corresponding in-die target (e.g., trained on matching of similarly biased/labelled reference and in-die targets).

Various multiscale approaches to machine learning offer different ways of implementing such a model. For example, the trained ML model may comprise a first or interfield model component or first/interfield neural network (e.g., trained in the present manner) and a second or intrafield model component or neural network trained to operate in combination with the interfield component. These components may be trained to minimize a combined model error, where intrafield and interfield content are appropriately bucketed.

In an implementation, a present training method may train a model M which comprises consists of N factors [A, B, . . . ], such that the pupil response Y=M*vec(c)+error. Naively, a full model M=A+B+C+ . . . + A*B+A*C+B*C+ . . . +A*B*C+ . . . can be used. A large collection of [A, B, C, etc.] training labels may be used for decomposition (i.e., finding elements in effect strength vector vec(c), and their p-values).

In this embodiment, an additional factor Z for the intrafield content may be added with the correct statistical nesting e.g., A(Z), and the effect strength c and p-value for this intrafield factor Z may be calculated. Leveraging ML techniques will result in effect strengths c' of overall smaller (effective) models M. In all cases, the model error is minimized.

In this manner, both the reference target pupils and biased in-die target pupils are assigned overlay labels, such that the former encodes the low spatial-frequency OV content, and the latter encodes the higher spatial frequency OV content. The biased in-die targets will augment the overlay training labels; this improves the metrology recipe by explicitly learning the intrafield fingerprint, thereby enabling intrafield label correction. Correcting for intrafield overlay variations will improve the accuracy and precision of the inferred overlay on wafer.

In the HVM environment, the in-die target biases are not required and non-biased in-die targets may be used, with the trained ML model (and measurement recipe more generally) used to obtain an overlay value from an in-die target. However, it may be preferred to use the same reticle for training and production (to ensure similar performance and reduce cost). This would have little effect on the overlay inference other than the need to take into account (e.g., remove or subtract) each known overlay bias from the inferred overlay value from the corresponding target. As such, since the applied bias is known a priori, it does not impact the quality of the device monitoring, since offsets can be applied to correct for the applied reticle bias before applying models to enable a correction loop.

Figure 5:
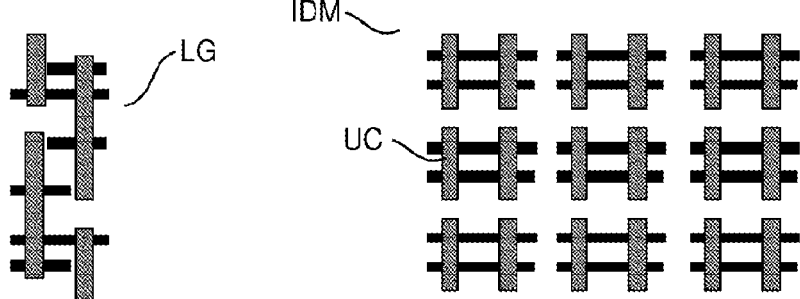
FIG. 5 is a schematic illustration of a method of product structure simplification for designing an in-die target.

The in-die targets should act as a proxy for the (non-periodic) in-die device patterns (e.g., logic structures). As such, the in-die targets should be representative of the logic structures within the die (i.e., the logic circuits for which they act as proxy). The design of such logic circuits may be based on a device structure simplification method, where elements of the logic structure are extracted from a unit cell which may be repeated to form a periodic target. FIG. 5 illustrates such a method. Logic circuitry LG may comprise two elements in a non-periodic arrangement. The in-device target IDM may comprise a simplification of the final after-etch pattern by comprising multiple unit cells UC formed e.g., using repetition of elements having similar dimensions (e.g., CD) and spacings as the elements within the logic circuitry. In this way, an in-device metrology IDM target comprises structures of a similar size or resolution of the product/logic structures but has a periodic pattern allowing optical measurement of overlay. As such, they may resemble as closely as possible the relevant product structures, but have a periodic pattern.

In addition to measuring the in-die targets using scatterometry method, the in-die targets may also be measured using a scanning electron microscope (SEM) such as an e-beam tool to obtain reference data for the IDM scatterometry measurements, e.g., to improve matching to SEM overlay data (such as destructive or decap SEM OV data). Such SEM overlay data is often used as reference data that is entrenched in HVM fabs.

Further embodiments are disclosed in the subsequent list of numbered clauses:

1. A method of determining a measurement recipe for measurement of in-die targets located within one or more die areas of an exposure field; the method comprising:

obtaining first measurement data relating to measurement of a plurality of reference targets, said reference targets comprising respective different overlay biases and being located in at least one reference target cluster for each exposure field on a training substrate; wherein said first measurement data further relates to measurement of said reference targets using a plurality of different acquisition settings for acquiring said measurement data;

obtaining second measurement data relating to measurement of a plurality of in-die targets, said in-die targets comprising respective different overlay biases and being distributed over each exposure field; wherein said second measurement data further relates to measurement of said in-die targets using said plurality of different acquisition settings for acquiring said measurement data;

training one or more machine learning models using at least said first measurement data to obtain a plurality of candidate measurement recipes, wherein said candidate measurement recipes comprise a plurality of combinations of a trained machine learned model and a corresponding acquisition setting; and determining a preferred measurement recipe from said candidate measurement recipes using said second measurement data.

2. A method as defined in clause 1, wherein said in-die targets and reference targets comprise corresponding target pairs of one in-die target and one reference target, each pair having corresponding said overlay biases, and wherein said step of determining a preferred measurement recipe comprises:

determining a matching metric for each candidate measurement recipe from a comparison of recipe performance for each of said pairs of in-die targets and reference targets; and using the matching metric in selecting the preferred measurement recipe from said candidate measurement recipes.

3. A method as defined in clause 2, comprising ranking said candidate measurement recipes according to one or more performance indicators, where said one or more performance indicators comprises said matching metric.

4. A method as defined in clause 1, 2 or 3, wherein said first measurement data comprises first labeled training data for training said one or more machine learning models, the first labeled training data comprising measurements from each reference target labeled by its respective overlay bias.

5. A method as defined in any preceding clause, comprising training said one or more models for intrafield variation using said second metrology data.

6. A method as defined in clause 5, wherein said second measurement data comprises second labeled training data for training said one or more machine learning models, the second labeled training data comprising measurements from each reference target labeled by its respective overlay bias.

7. A method as defined in clause 6, wherein said training for intrafield variation is based on differences over each field between said first measurement data and said second measurement data.

8. A method as defined in clause 6 or 7, wherein said in-die targets and reference targets comprise corresponding target pairs of one in-die target and one reference target, each pair having corresponding said overlay biases wherein said differences are matched for each target pair, per field.

9. A method as defined in any of clauses 6 to 8, wherein the training is such that the machine learning model is trained on a single on-product overlay value per field determined from the first measurement data and multiple on-product overlay values per field determined from the second measurement data.

10. A method as defined in any of clauses 6 to 9, wherein said training for intrafield variation comprises training an intrafield model component of the machine learning model trained to minimize said intrafield variation.

11. A method as defined in clause 10, wherein said training for intrafield variation also comprises training an interfield model component of the machine learning model; wherein said intrafield model component and interfield model component are trained to minimize a combined model error relating to interfield variation and said interfield variation.

12. A method as defined in any of preceding clause, wherein each measurement within said measurement data comprises an angularly resolved spectrum of scattered radiation from a target.

13. A method as defined in any of preceding clause, wherein said in-die targets are representative of non-periodic structures within the exposure field for which they act as proxy.

14. A method as defined in clause 13, wherein said in-die targets are a periodic structure simplification of said non-periodic structures, comprising repetitions of a unit cell elements extracted from said non-periodic structures.

15. A method as defined in any of preceding clause, comprising using said preferred measurement recipe to measure in-die targets on a production substrate, so as to infer an overlay value for each in-die target.

16. A method as defined in clause 15, comprising using the same reticle to expose the product substrate as used to expose the training substrate and said inferring an overlay value accounts for the bias of the in-die targets.

17. A target located within a die area of an exposure field comprising a non-zero overlay bias for use in the method of any of claims 1 to 16.

18. A target as defined in clause 17, wherein the target comprises a corresponding target for some or all of the reference targets in the reference target cluster.

19. A target as defined in clause 18, wherein the corresponding target comprises a corresponding imposed bias, such that the imposed bias of the corresponding target corresponds to the bias of the reference target.

20. A computer program comprising instructions which, when the computer program is executed by a computer, cause the computer to perform the method of any of clauses 1 to 16.

21. A computer-readable data carrier having stored thereon the computer program of clause 20.

22. A data processing apparatus comprising means for carrying out the method of any of claims 1 to 16.

23. A metrology apparatus configured to perform the method of any of claims 1 to 16.

To summarize, the methods described herein comprise an improved matching of reference to in-die, which will improve overlay sensitivity (the get OV-set OV sensitivity, i.e., the full model of which the overlay dependent method sensitivity, and the possibility to learn intrafield content, are parts). At least some embodiments improve the recipe by explicitly learning for the intra-field fingerprint. These embodiments also enable intrafield label correction.

When it is stated that in-die or reference targets comprise respective different overlay biases, this includes the possibility that the bias for at least one of each target set may be zero.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term target should not be construed to mean only dedicated targets formed for the specific purpose of metrology. The term target should be understood to encompass other structures, including product structures, which have properties suitable for metrology applications.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:

obtaining first measurement data relating to measurement of a plurality of reference targets, the reference targets comprising respective different overlay biases and being located in at least one reference target cluster for each exposure field on a training substrate, wherein the first measurement data further relates to measurement of the reference targets using a plurality of different acquisition settings for acquiring the measurement data;

obtaining second measurement data relating to measurement of a plurality of in-die targets, the in-die targets comprising respective different overlay biases and being distributed over each exposure field, wherein the second measurement data further relates to measurement of the in-die targets using the plurality of different acquisition settings for acquiring the measurement data;

training one or more machine learning models using at least the first measurement data to obtain a plurality of candidate measurement recipes, wherein the candidate measurement recipes comprise a plurality of combinations of a trained machine learned model and a corresponding acquisition setting;

determining a selected measurement recipe from the candidate measurement recipes using the second measurement data; and physically configuring an in-die target measurement process based on the selected measurement recipe and/or providing a signal representing, or based on, the selected measurement recipe to a system for use in configuration of the in-die target measurement process.

2. The method as claimed in claim 1, wherein the in-die targets and reference targets comprise corresponding target pairs of one in-die target and one reference target, each pair having a corresponding overlay bias, and wherein the determining a selected measurement recipe comprises:

determining a matching metric for each candidate measurement recipe from a comparison of recipe performance for each of the pairs of in-die targets and reference targets; and using the matching metric in selecting the selected measurement recipe from the candidate measurement recipes.

3. The method as claimed in claim 2, further comprising ranking the candidate measurement recipes according to one or more performance indicators, where the one or more performance indicators comprises the matching metric.

4. The method as claimed in claim 1, wherein the first measurement data comprises first labeled training data for training the one or more machine learning models, the first labeled training data comprising measurements from each reference target labeled by its respective overlay bias.

5. The method as claimed in claim 1, further comprising training the one or more machine learning models for intrafield variation using the second metrology data.

6. The method as claimed in claim 5, wherein the second measurement data comprises second labeled training data for training the one or more machine learning models, the second labeled training data comprising measurements from each reference target labeled by its respective overlay bias.

7. The method as claimed in claim 5, wherein the training for intrafield variation is based on differences over each field between the first measurement data and the second measurement data.

8. The method as claimed in claim 7, wherein the in-die targets and reference targets comprise corresponding target pairs of one in-die target and one reference target, each pair having a corresponding overlay bias, wherein the differences are matched for each target pair, per field.

9. The method as claimed in claim 5, wherein the training is such that the machine learning model is trained on a single on-product overlay value per field determined from the first measurement data and multiple on-product overlay values per field determined from the second measurement data.

10. The method as claimed in claim 5, wherein the training for intrafield variation comprises training an intrafield model component of the machine learning model trained to minimize the intrafield variation.

11. The method as claimed in claim 10, wherein the training for intrafield variation also comprises training an interfield model component of the machine learning model, wherein the intrafield model component and interfield model component are trained to minimize a combined model error relating to interfield and intrafield variation.

12. The method as claimed in claim 1, wherein each measurement associated with the measurement data comprises an angularly resolved spectrum of scattered radiation from a target.

13. The method as claimed in claim 1, wherein the in-die targets are representative of non-periodic structures within the exposure field for which they act as proxy.

14. The method as claimed in claim 13, wherein the in-die targets are a periodic structure simplification of the non-periodic structures, comprising repetitions of a unit cell element extracted from the non-periodic structures.

15. The method as claimed in claim 1, further comprising using the selected measurement recipe to measure in-die targets on a production substrate, so as to infer an overlay value for each in-die target.

16. The method as claimed in claim 15, comprising using a same reticle to expose the product substrate as used to expose the training substrate and the inferring an overlay value accounts for the bias of the in-die targets.

17. A target located within a die area of an exposure field comprising a non-zero overlay bias for use in the method of claim 1.

18. A data processing apparatus comprising means for carrying out the method of claim 1.

19. A metrology apparatus configured to perform the method of claim 1.

20. A non-transitory computer-readable data carrier having stored thereon a computer program that, when executed by a computer system, is configured to cause the computer system to at least:

obtain first measurement data relating to measurement of a plurality of reference targets, the reference targets comprising respective different overlay biases and being located in at least one reference target cluster for each exposure field on a training substrate, wherein the first measurement data further relates to measurement of the reference targets using a plurality of different acquisition settings for acquiring the measurement data;

obtain second measurement data relating to measurement of a plurality of in-die targets, the in-die targets comprising respective different overlay biases and being distributed over each exposure field, wherein the second measurement data further relates to measurement of the in-die targets using the plurality of different acquisition settings for acquiring the measurement data;

train one or more machine learning models using at least the first measurement data to obtain a plurality of candidate measurement recipes, wherein the candidate measurement recipes comprise a plurality of combinations of a trained machine learned model and a corresponding acquisition setting;

determine a selected measurement recipe from the candidate measurement recipes using the second measurement data; and cause physical configuration an in-die target measurement process based on the selected measurement recipe and/or provide a signal representing, or based on, the selected measurement recipe to a system for use in configuration of the in-die target measurement process.

* * * * *